United States Patent
Kato

(10) Patent No.: US 9,748,396 B2
(45) Date of Patent: Aug. 29, 2017

(54) THIN FILM TRANSISTOR AND METHOD OF MANUFACTURING THE SAME

(71) Applicant: Panasonic Liquid Crystal Display Co., Ltd., Himeji-shi, Hyogo (JP)

(72) Inventor: Tomoya Kato, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 15/370,575

(22) Filed: Dec. 6, 2016

(65) Prior Publication Data

US 2017/0084751 A1 Mar. 23, 2017

Related U.S. Application Data

(60) Division of application No. 14/590,508, filed on Jan. 6, 2015, now Pat. No. 9,543,449, which is a
(Continued)

(30) Foreign Application Priority Data

Aug. 1, 2012 (JP) ................................. 2012-171048

(51) Int. Cl.
*H01L 29/786* (2006.01)
*H01L 29/45* (2006.01)
(Continued)

(52) U.S. Cl.
CPC ...... *H01L 29/78606* (2013.01); *H01L 21/441* (2013.01); *H01L 29/24* (2013.01);
(Continued)

(58) Field of Classification Search
CPC ............... H01L 29/78693; H01L 27/45; H01L 27/49085; H01L 27/4908; H01L 27/66768;
(Continued)

(56) References Cited

U.S. PATENT DOCUMENTS

| 5,552,909 A | 9/1996 | Onisawa et al. |
| 7,511,300 B2 | 3/2009 | Lee et al. |
(Continued)

FOREIGN PATENT DOCUMENTS

| JP | 7-072510 | 3/1995 |
| JP | 2004-140319 | 5/2004 |
(Continued)

OTHER PUBLICATIONS

Office Action issued in corresponding Japanese Patent Application No. 2012-171048, Mar. 8, 2016, 2 pages.
(Continued)

*Primary Examiner* — Christine Enad
(74) *Attorney, Agent, or Firm* — Hamre, Schumann, Mueller & Larson, P.C.

(57) ABSTRACT

As source and drain wiring, a base layer and a cap layer are each formed of a MoNiNb alloy film, and a low-resistance layer is formed of Cu. The resultant laminated metal film is patterned through one-time wet etching to form a drain electrode and a source electrode. Cu serving as a main wiring layer does not corrode because of being covered with a MoNiNb alloy having good corrosion resistance. Further, even when a protective insulating film including an oxide is formed by plasma CVD in an oxidizing atmosphere, Cu is not oxidized. With the wet etching, the sidewall taper angle of the laminated metal film can be controlled to 20 degrees or more and less than 70 degrees.

15 Claims, 11 Drawing Sheets

Related U.S. Application Data continuation of application No. PCT/JP2013/004593, filed on Jul. 29, 2013.

(51) Int. Cl.

| | | |
|---|---|---|
| *H01L 21/441* | (2006.01) | |
| *H01L 29/49* | (2006.01) | |
| *H01L 29/66* | (2006.01) | |
| *H01L 29/24* | (2006.01) | |
| *G02F 1/1343* | (2006.01) | |
| *G02F 1/1362* | (2006.01) | |
| *G02F 1/1368* | (2006.01) | |

(52) U.S. Cl.
CPC ............ *H01L 29/45* (2013.01); *H01L 29/458* (2013.01); *H01L 29/4908* (2013.01); *H01L 29/66765* (2013.01); *H01L 29/66969* (2013.01); *H01L 29/78693* (2013.01); *G02F 1/1368* (2013.01); *G02F 1/13439* (2013.01); *G02F 1/134336* (2013.01); *G02F 1/134363* (2013.01); *G02F 1/136227* (2013.01); *G02F 1/136286* (2013.01); *G02F 2201/121* (2013.01); *G02F 2201/123* (2013.01)

(58) Field of Classification Search
CPC ..... H01L 27/458; H01L 21/441; H01L 29/45; H01L 29/49085; H01L 29/4908; H01L 29/66768; H01L 29/458; H01L 29/78606

See application file for complete search history.

(56) References Cited

U.S. PATENT DOCUMENTS

| | | | | |
|---|---|---|---|---|
| 9,171,803 | B2 | 10/2015 | Koezuka et al. | |
| 2004/0118814 | A1* | 6/2004 | Kim | C09K 13/08 216/96 |
| 2006/0292888 | A1 | 12/2006 | Park et al. | |
| 2008/0017862 | A1* | 1/2008 | Lee | G02F 1/136286 257/59 |
| 2008/0286974 | A1 | 11/2008 | Kim et al. | |
| 2009/0002586 | A1* | 1/2009 | Kimura | G02F 1/136213 349/39 |
| 2009/0153056 | A1* | 6/2009 | Chen | H01L 29/458 315/51 |
| 2010/0308325 | A1 | 12/2010 | Imai | |
| 2011/0019139 | A1 | 1/2011 | Cui et al. | |
| 2011/0147736 | A1 | 6/2011 | Miyanaga et al. | |
| 2011/0176081 | A1 | 7/2011 | Sonoda et al. | |
| 2011/0316057 | A1 | 12/2011 | Kurata et al. | |
| 2012/0051120 | A1 | 3/2012 | Kamata | |
| 2012/0091452 | A1 | 4/2012 | Ohta et al. | |
| 2012/0228604 | A1* | 9/2012 | Choi | H01L 27/1225 257/43 |
| 2015/0014684 | A1 | 1/2015 | Miyanaga et al. | |

FOREIGN PATENT DOCUMENTS

| | | |
|---|---|---|
| JP | 2004-193620 | 7/2004 |
| JP | 2007-005790 | 1/2007 |
| JP | 2010-080934 | 4/2010 |
| JP | 2011-146692 | 7/2011 |
| JP | 2011-151194 | 8/2011 |
| JP | 2012-033896 | 2/2012 |
| JP | 2012-074125 | 4/2012 |

OTHER PUBLICATIONS

Office Action issued in corresponding Japanese Patent Application No. 2012-171048, Nov. 4, 2015, 3 pages.

Office Action issued in corresponding Japanese Patent Application Serial No. 2016-114616, Feb. 28, 2017, 2 pages.

* cited by examiner

| Cu | 320~375 nm/min |
|---|---|
| Mo-20Ni-5Nb | 67~94 nm/min |
| a-IGZO | 3 nm/min |

SAMPLE 1    SAMPLE 2

AFTER IMMERSION
IN SD ETCHING SOLUTION

FIG.11

| No. | Sample Cap layer Composition (at%) | Oxidation resistance | | | Processability | | | D/E resistance | | | Total evaluation |
|---|---|---|---|---|---|---|---|---|---|---|---|
| | | Sheet resistance [ohms/sq.] | Surface spot occurrence | Evaluation | Recession amount of base layer [μm] | Taper angle [deg] | Evaluation | Etching rate [nm/min] | Selectivity ratio vs. SiO$_2$ | Evaluation | |
| 1 | Pure Mo (3N) | 0.77 | Many | No-Good | 0.61 | <10 | No-Good | 20.3 | 2.8 | No-Good | No-Good |
| 2 | Mo-4Nb | 0.54 | Many | No-Good | 0.61 | <10 | No-Good | 16.0 | 3.5 | No-Good | No-Good |
| 3 | Mo-10Ni | 0.066 | A few | No-Good | 3.2 | 28 | No-Good | 6.7 | 8.3 | Good | No-Good |
| 4 | Mo-10Ni-4Nb | 0.064 | None | Good | 0.63 | 25 | Good | 6.4 | 8.7 | Good | Good |
| 5 | Mo-10Ni-20Nb | 0.065 | None | Good | 0.61 | 58 | Good | 5.8 | 9.7 | Good | Good |
| 6 | Mo-10Ni-30Nb | 0.064 | None | Good | 0.44 | 87 | No-Good | 5.5 | 10.2 | Good | No-Good |
| 7 | Mo-15Ni-5Nb | 0.067 | None | Good | 0.6 | 35 | Particularly-Good | 5.8 | 97.0 | Good | Particularly-Good |
| 8 | Mo-15Ni-10Nb | 0.068 | None | Good | 0.57 | 44 | Particularly-Good | 5.2 | 10.8 | Good | Particularly-Good |
| 9 | Mo-20Ni-5Nb | 0.068 | None | Good | 0.61 | 31 | Particularly-Good | 5.2 | 10.8 | Good | Particularly-Good |
| 10 | Mo-20Ni-10Nb | 0.067 | None | Good | 0.59 | 42 | Particularly-Good | 4.9 | 11.5 | Good | Particularly-Good |
| 11 | Mo-40Ni-4Nb | 0.070 | None | Good | 0.75 | 26 | Good | 4.6 | 12.2 | Good | Good |
| 12 | Mo-40Ni-20Nb | 0.069 | None | Good | 0.68 | 55 | Good | 4.3 | 13.1 | Good | Good |
| 13 | Mo-50Ni-4Nb | 0.070 | None | Good | 1.7 | 34 | No-Good | 4.0 | 14.1 | Good | No-Good | ained, a higher pixel count such as 4K resolution (4K2K) or the like, and a larger screen size. On the other hand, in applications of small to medium-size panels represented by tablet devices and smartphones, there has been an increasing demand for a pixel size with higher definition (fine pixel size) and a narrower frame by virtue of a circuit incorporating technology. For responding to those demands, in the active matrix substrate, a TFT element having higher mobility and higher integration, and a signal line having lower resistance are required. In this regard, an interest has been expressed in forming a channel of the TFT with an oxide semiconductor instead of amorphous silicon, which has been hitherto typically used. In particular, a TFT using a transparent amorphous oxide semiconductor (TAOS) has recently attracted attention as a device achieving both a higher carrier mobility and uniformity in characteristics.

SUMMARY

Now, as a typical structure of the TFT, a channel etch (CHE) type and a channel etch stopper (CES) type are given. FIG. 13 is a schematic vertical sectional view of the CHE-type TFT and FIG. 14 is a schematic vertical sectional view of the CES-type TFT. Both the TFTs are of an inverted staggered type. In each of the TFTs, a gate electrode 52, a gate insulating film 54, and a channel layer 56 are formed in this order on an insulating substrate 50 formed of glass or the like. A drain electrode 58 and a source electrode 60 are formed thereon generally through patterning of the same metal thin film (hereinafter referred to as SD metal).

In the CHE-type TFT illustrated in FIG. 13, the SD metal is laminated so as to cover a surface of the channel layer 56. In etching of the SD metal, the channel layer 56 is exposed in a space that separates the source from the drain. Therefore, the etching of the SD metal needs to be performed so that the channel layer 56 is not etched and good physical properties of a semiconductor are not degraded owing to damage through the etching.

THIN FILM TRANSISTOR AND METHOD OF MANUFACTURING THE SAME

CROSS-REFERENCE TO RELATED APPLICATION

The present application is a Bypass Continuation of International Application No. PCT/JP2013/004593, filed on Jul. 29, 2013, which claims priority from Japanese Patent application JP2012-171048 filed on Aug. 1, 2012. The contents of these applications are hereby incorporated into the present application by reference in their respective entireties.

TECHNICAL FIELD

The present invention relates to a thin film transistor (TFT) using an oxide semiconductor as its channel portion, and a method of manufacturing the same.

BACKGROUND

A liquid crystal panel including an active matrix substrate is used for products such as flat panel televisions, tablet devices, and smartphones. In applications of large-size panels represented by flat panel televisions, there has been a demand for higher drive frequency for realization of three dimensional display and a moving image with higher qual- In the CES-type TFT illustrated in FIG. 14, after formation of the channel layer 56, a stopper layer 70 for protecting the channel layer 56 is formed in order to prevent contact of an etching solution during patterning of the SD metal. The stopper layer 70 is patterned with a photolithography technology. Portions of the stopper layer 70 at which the drain electrode 58 and the source electrode 60 are put into contact with the channel layer 56 are removed, but a portion of the stopper layer 70 on the channel between the source and the drain is left as an etching stopper 72. After that, the SD metal is laminated and patterned. Thus, the SD metal on the etching stopper 72 is removed through etching to form the drain electrode 58 and the source electrode 60 separated from each other. In order to protect such transistor structure, a protective film 62 is formed thereon. For example, in the case of a liquid crystal panel, a contact hole 64 is formed in the protective film 62, and a transparent pixel electrode 66 laminated on the protective film 62 is electrically connected to the source electrode 60 through the contact hole 64.

A manufacturing process of the CHE-type omits the formation and patterning of the stopper layer 70, and hence, enables a simpler process than that of the CES-type and lower manufacturing cost. Accordingly, realization of a CHE-type TFT using an oxide semiconductor as the channel layer 56 has been desired.

However, there is the following problem. It is difficult to combine a material and film structure of the SD metal with its etching solution to establish the manufacturing process of the CHE-type. In other words, it is difficult to combine a material and film structure of the SD metal with its etching solution to achieve an excellent shape through etching processing, prevent dissolution of a TAOS layer, and prevent degradation in physical properties of a semiconductor.

In addition, characteristics of an oxide semiconductor may be degraded through exposure to a reducing atmosphere. Therefore, in the CHE-type TFT using an oxide semiconductor, it is desired that the protective film 62 and the gate insulating film 54, which are put into contact with the channel layer 56, be an oxide insulator formed of silicon oxide or the like. However, the oxide insulator is formed by chemical vapor deposition (CVD) in an oxidizing atmosphere. And therefore, when surfaces of the drain electrode 58 and the source electrode 60 are formed of a metal susceptible to oxidation such as copper (Cu), those surfaces are oxidized during formation of the protective film 62, resulting in a problem in that a defect such as increased electrical resistance and disconnection occurs.

As a candidate material for the source electrode and drain electrode (those two electrodes are hereinafter collectively referred to as SD electrode), there are given a single layer structure formed of a metal that is difficult to be oxidized and a three-layer structure obtained by sandwiching a low-resistance material such as Cu between other metal materials from top and bottom. In the case of the three-layer structure, a lower layer is a barrier layer for preventing Cu from diffusing into a semiconductor layer, and is desired to have excellent ohmic contact property with the semiconductor layer. In addition, an upper layer is a cap layer for preventing oxidation of Cu. When the three-layer structure is patterned through, for example, stepwise etching, the above-mentioned advantage of the CHE-type of achieving a simpler manufacturing process is impaired. In contrast, when the three-layer structure is patterned through one-time etching, any of the layers may be recessed in a lateral direction largely as compared to other layers owing to an influence of a difference in their etching rates and the like. For example, when only the cap layer is etched deeply in its side, the expected function of preventing oxidation of the Cu layer is impaired. On the other hand, when the cap layer has a low etching rate, a side surface of a laminated structure formed through the etching has a large taper angle and becomes almost vertical or a reverse tapered shape. As a result, there is a problem in that coatability of the protective film or the like deposited on the TAOS layer or the SD electrode is impaired.

The present invention has been made for solving the above-mentioned problems, and in particular, it is an object of the present invention to provide a preferred structure of electrodes and a channel layer particularly in a TFT using an oxide semiconductor as its channel layer, and to provide a method of manufacturing the same. In addition, it is another object of the present invention to provide a TFT structure and a method of manufacturing the same, which can be applied even to a TFT using amorphous silicon (a-Si) as its channel layer.

(1) According to one embodiment of the present invention, there is provided a thin film transistor, including: a gate electrode; a gate insulating film; a channel layer containing an oxide semiconductor; a source electrode and a drain electrode; and a protective film, in which: at least one of the gate electrode, the source electrode, the drain electrode, and any other conductor wiring layer contributing to operation of the thin film transistor is formed of a laminated metal film including a lower barrier layer, a low-resistance main wiring layer, and an upper cap layer; the low-resistance main wiring layer contains one of copper and a copper alloy; and at least one of the lower barrier layer and the upper cap layer contains a molybdenum alloy containing nickel and niobium.

(2) In the thin film transistor as described in Item (1): the gate electrode may be formed on an insulating substrate; the gate insulating film may be laminated on the insulating substrate so as to cover the gate electrode; the channel layer may contain the oxide semiconductor disposed above the gate electrode with the gate insulating film interposed therebetween; the source electrode and the drain electrode may be disposed on the channel layer so as to be separated from each other with a space therebetween; and the protective film may cover the source electrode, the drain electrode, and the channel layer in a part exposed in the space.

(3) In the thin film transistor as described in Item (1): the gate electrode may be formed on an insulating substrate; the gate insulating film may be laminated on the insulating substrate so as to cover the gate electrode; the source electrode and the drain electrode may be disposed on the gate insulating film so as to be separated from each other with a space therebetween; the channel layer may contain the oxide semiconductor disposed so as to straddle the space between the source electrode and the drain electrode; and the protective film may cover the source electrode, the drain electrode, and the channel layer.

(4) The thin film transistor as described in Item (1) may further include a channel protective layer. In the thin film transistor: the gate electrode may be formed on an insulating substrate; the gate insulating film may be laminated on the insulating substrate so as to cover the gate electrode; the channel layer may contain the oxide semiconductor disposed above the gate electrode with the gate insulating film interposed therebetween; the channel protective layer may be disposed on a part of the channel layer and a part of the gate insulating film; the source electrode and the drain electrode may be disposed on the channel layer so as to be separated from each other with a space therebetween; and the protective film may cover the source electrode, the drain electrode, and the channel protective layer.

(5) In the thin film transistor as described in Item (1), the molybdenum alloy may contain 10 to 40 atomic % of nickel and 4 to 20 atomic % of niobium, with the balance being molybdenum.

(6) In the thin film transistor as described in Item (1), at least one of the gate electrode, and the source electrode and the drain electrode, formed of the laminated metal film including the lower barrier layer, the low-resistance main wiring layer, and the upper cap layer may have a sidewall taper angle of 20 degrees or more and less than 70 degrees.

(7) According to another embodiment of the present invention, there is provided a method of manufacturing a thin film transistor including a gate electrode, a gate insulating film, a channel layer containing an oxide semiconductor, a source electrode, a drain electrode, and a protective film, the method including: forming at least one of the gate electrode, the source electrode, the drain electrode, and any other conductor wiring layer contributing to operation of the thin film transistor by using a laminated metal film including a lower barrier layer, a low-resistance main wiring layer, and an upper cap layer, the low-resistance main wiring layer containing one of copper and an copper alloy, at least one of the lower barrier layer and the upper cap layer containing a molybdenum alloy containing nickel and niobium; and patterning the laminated metal film through one-time wet etching using a solution mainly containing hydrogen peroxide and an organic acid.

(8) The method of manufacturing a thin film transistor as described in Item (7) may further include: forming the gate electrode on an insulating substrate; forming the gate insulating film on the gate electrode; forming the channel layer mainly containing the oxide semiconductor on the gate insulating film; forming the laminated metal film including the lower barrier layer containing a molybdenum alloy containing nickel and niobium, the low-resistance main wiring layer containing one of copper and a copper alloy, and the upper cap layer containing a molybdenum alloy containing nickel and niobium so that the laminated metal film covers the channel layer; forming the source electrode and the drain electrode so as to be separated from each other with a space therebetween on the channel layer by patterning the laminated metal film through one-time wet etching using a solution mainly containing hydrogen peroxide and an organic acid; and forming the protective film for covering the source electrode, the drain electrode, and the channel layer in a part exposed in the space.

(9) The method of manufacturing a thin film transistor as described in Item (7) may further include: forming the gate electrode on an insulating substrate; forming the gate insulating film on the gate electrode; forming the laminated metal film including the lower barrier layer containing a molybdenum alloy containing nickel and niobium, the low-resistance main wiring layer containing one of copper and a copper alloy, and the upper cap layer containing a molybdenum alloy containing nickel and niobium so that the laminated metal film covers the gate insulating film; forming the source electrode and the drain electrode so as to be separated from each other with a space therebetween above the gate electrode by patterning the laminated metal film through one-time wet etching using a solution mainly containing hydrogen peroxide and an organic acid; forming, after the forming of the source electrode and the drain electrode, the channel layer mainly containing the oxide semiconductor so as to straddle the space between the source electrode and drain electrode; and forming the protective film for covering the source electrode, the drain electrode, and the channel layer.

(10) The method of manufacturing a thin film transistor as described in Item (7) may further include: forming the gate electrode on an insulating substrate; forming the gate insulating film on the gate electrode; forming the channel layer mainly containing the oxide semiconductor on the gate insulating film; forming a channel protective layer on a part of the channel layer and a part of the gate insulating film; forming the laminated metal film including the lower barrier layer containing a molybdenum alloy containing nickel and niobium, the low-resistance main wiring layer containing one of copper and a copper alloy, and the upper cap layer containing a molybdenum alloy containing nickel and niobium so that the laminated metal film covers the channel layer; forming the source electrode and the drain electrode so as to be separated from each other with a space therebetween above the gate electrode by patterning the laminated metal film through one-time wet etching using a solution mainly containing hydrogen peroxide and an organic acid; and forming the protective film for covering the source electrode, the drain electrode, and the channel protective layer.

(11) The method of manufacturing a thin film transistor as described in Item (7) may further include forming a contact hole through dry etching of the protective film. In the method, the upper cap layer of one of the source electrode and the drain electrode is exposed at a bottom of the contact hole.

(12) In the method of manufacturing a thin film transistor as described in Item (7), the molybdenum alloy may contain 10 to 40 atomic % of nickel and 4 to 20 atomic % of niobium, with the balance being molybdenum.

(13) In the method of manufacturing a thin film transistor as described in Item (7), the oxide semiconductor may include an oxide containing at least one kind of metal element selected from the group consisting of: indium; gallium; zinc; and tin.

(14) In the method of manufacturing a thin film transistor as described in Item (7), at least one of the gate electrode, the source electrode, the drain electrode, and the any other conductor wiring layer contributing to the operation of the thin film transistor may have a sidewall taper angle of 20 degrees or more and less than 70 degrees.

(15) According to still another embodiment of the present invention, there is provided a thin film transistor, including: a gate electrode; a gate insulating film; a channel layer containing amorphous silicon; a source electrode and a drain electrode; and a protective film, in which: at least one of the gate electrode, the source electrode, the drain electrode, and any other conductor wiring layer contributing to operation of the thin film transistor is formed of a laminated metal film including a lower barrier layer, a low-resistance main wiring layer, and an upper cap layer; the low-resistance main wiring layer contains one of copper and a copper alloy; and at least one of the lower barrier layer and the upper cap layer contains a molybdenum alloy containing nickel and niobium.

(16) According to yet another embodiment of the present invention, there is provided a method of manufacturing a thin film transistor including a gate electrode, a gate insulating film, a channel layer containing amorphous silicon, a source electrode, a drain electrode, and a protective film, the method including: forming at least one of the gate electrode, the source electrode, the drain electrode, and any other conductor wiring layer contributing to operation of the thin film transistor by using a laminated metal film including a lower barrier layer, a low-resistance main wiring layer, and an upper cap layer, the low-resistance main wiring layer containing one of copper and a copper alloy, at least one of the lower barrier layer and the upper cap layer containing a molybdenum alloy containing nickel and niobium; and patterning the laminated metal film through one-time wet etching using a solution mainly containing hydrogen peroxide and an organic acid.

According to the present invention, in the manufacturing of the CHE-type TFT using an oxide semiconductor as its channel layer, the source electrode, the drain electrode, and the like can be prevented from oxidation and wet etching processing can be performed so as to form appropriate cross sections. In addition, the present invention can be also applied to the a-Si TFT.

BRIEF DESCRIPTION OF THE DRAWINGS

FIG. 11 is a table summarizing experimental result.

DETAILED DESCRIPTION

A CHE-type TFT adopting an oxide semiconductor according to an embodiment of the present invention is hereinafter described with reference to the drawings. In this embodiment, a description is given of the TFT to be used in a liquid crystal display panel.

Figure 1:
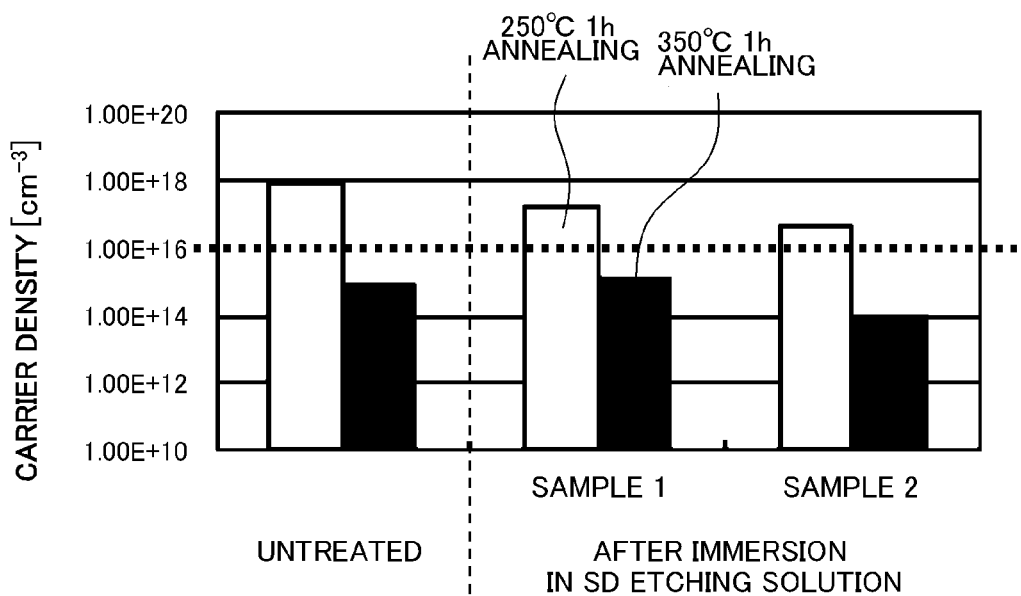
FIG. 1 is a graph showing a carrier density of an amorphous InGaZn composite oxide film after immersion in an etching solution for Cu wiring for 10 minutes according to the present invention.

FIG. 1 shows experimental results of simulating a wet etching process of a source and drain layer. FIG. 1 shows changes in the carrier density of an amorphous InGaZn composite oxide film after treatment through immersion in an etching solution for Cu wiring for 10 minutes according to the present invention, the etching solution mainly containing hydrogen peroxide and an organic acid and having a pH adjusted to 3. There are shown values for an untreated sample and two samples (sample 1 and sample 2) each subjected to the above-mentioned treatment in the same manner, after annealing at 250° C. and 350° C. for 1 hour. In this case, in each pair of bar graphs shown in FIG. 1, the left bar graph represents a value in the case of 250° C. and the right bar graph represents a value in the case of 350° C.

In order to obtain good TFT characteristics, the oxide semiconductor layer desirably has a carrier density of $10^{16}$ cm$^{-3}$ or less as physical properties of a single film. In the results shown in FIG. 1, all the samples have values of $10^{16}$ cm$^{-3}$ or less after the annealing at 350° C. for 1 hour, falling within a satisfactory characteristic range from a viewpoint of forming a TFT using a TAOS film as an active layer. That is, even when the TAOS film is put into contact with an etching solution for SD metal to be used in the present invention, good semiconductor physical properties are maintained by virtue of the annealing, and hence, a device structure of a channel etch type can be formed. Note that, with the annealing at 250° C. for 1 hour, all the samples have carrier densities of $10^{16}$ cm$^{-3}$ or more, and are unsuitable as a semiconductor layer regardless of the etching process.

Figure 2:
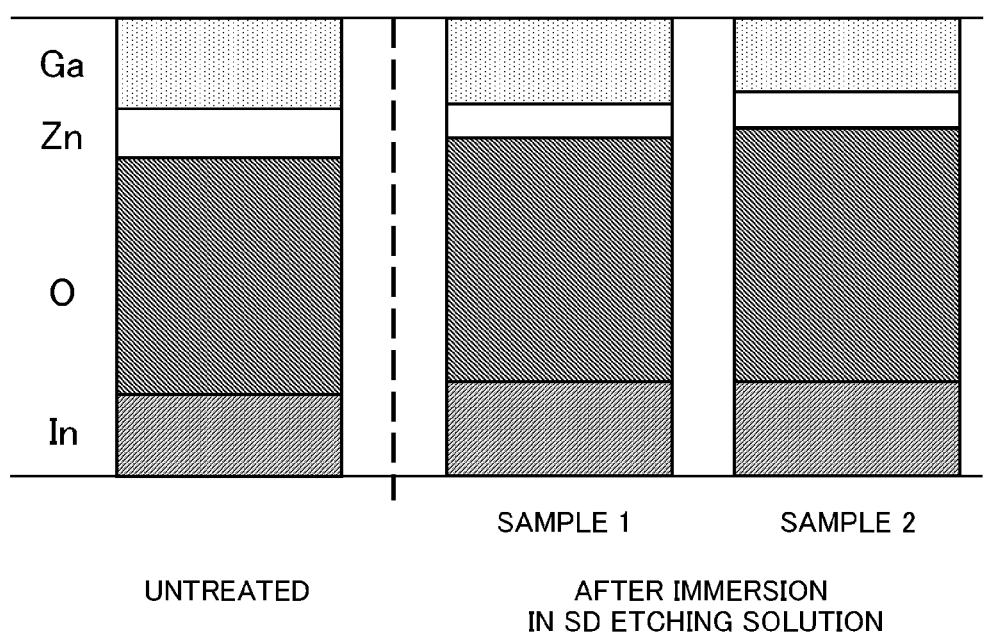
FIG. 2 is a schematic diagram showing changes in relative presence ratios of elements in the surface of an amorphous InGaZn composite oxide film before and after immersion in an etching solution for Cu wiring for 10 minutes according to the present invention.

As in FIG. 1, FIG. 2 shows experimental results of simulating a wet etching process of a source and drain layer. FIG. 2 shows changes in relative presence ratios of elements in the surface of an amorphous InGaZn composite oxide (a-IGZO) film before and after immersion in an etching solution for Cu wiring for 10 minutes according to the present invention, the etching solution having the same specifications as those in FIG. 1.

After the immersion in the etching solution, the presence ratio of zinc (Zn) relatively slightly reduces and the presence ratio of indium (In) relatively slightly increases. Those changes are caused by selective slight dissolution of Zn under the condition of pH=3, and there is no significant changes in the presence ratios.

Figures 3, 4:
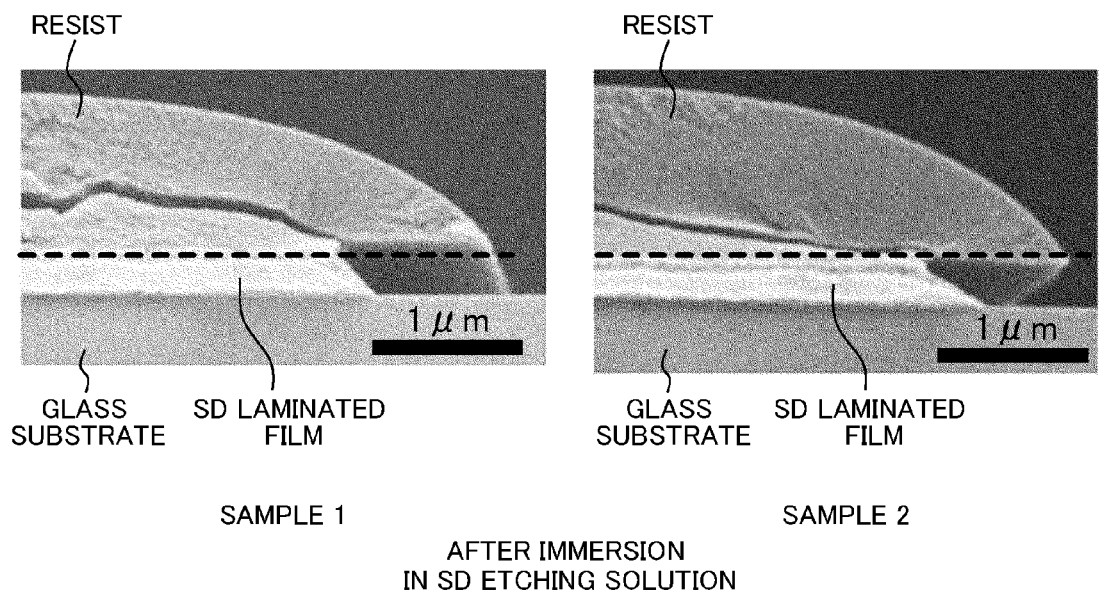
FIG. 3 is an explanatory diagram showing etching rates of a Cu film, a Mo alloy film, and an amorphous InGaZn composite oxide film in the case of using an etching solution for Cu wiring according to the present invention.
FIG. 4 shows SEM photographs of a processed cross section shape of a Mo alloy/Cu/Mo alloy three-layer film after etching through wet etching process of the present invention.

FIG. 3 shows etching rates of a Cu film, a molybdenum (Mo) alloy film (Mo-20 at % Ni-5 at % Nb), and an a-IGZO film through immersion in an etching solution for Cu wiring with the same specifications as those in FIGS. 1 and 2 according to the present invention. The etching rate of the a-IGZO film is low with respect to the Cu film and the Mo alloy film. Therefore, a sufficient etching selectivity ratio is achieved.

The results shown in FIGS. 1 to 3 reveal that, when the etching solution mainly containing hydrogen peroxide and an organic acid is adopted for the etching of a source and drain layer in a manufacturing process for a CHE-type TAOS-TFT, the oxide semiconductor layer is hardly etched and there is no degradation in the semiconductor physical properties.

FIG. 4 show scanning electron microscope (SEM) photographs of a processed cross section shape of a Mo alloy/Cu/Mo alloy three-layer structure after etching with the solution for Cu wiring described with reference to FIG. 1. The photographs of the samples 1 and 2 are shown next to each other. The composition of the Mo alloy is Mo-20 at % Ni-5 at % Nb. The thicknesses of the upper Mo alloy layer, the Cu layer, and the lower Mo alloy layer are 50 nm, 300 nm, and 20 nm, respectively. The etching is performed for a time period that is 1.5 times longer than a just etching time period. A good tapered shape was obtained, and no etching residue was observed.

The results shown in FIG. 4 reveal that the etching processing has no problem in itself.

Next, a description is given of a production process of a TFT substrate for a liquid crystal display by using the etching solution described with reference to FIGS. 1 to 4 according to the present invention.

Figure 5:
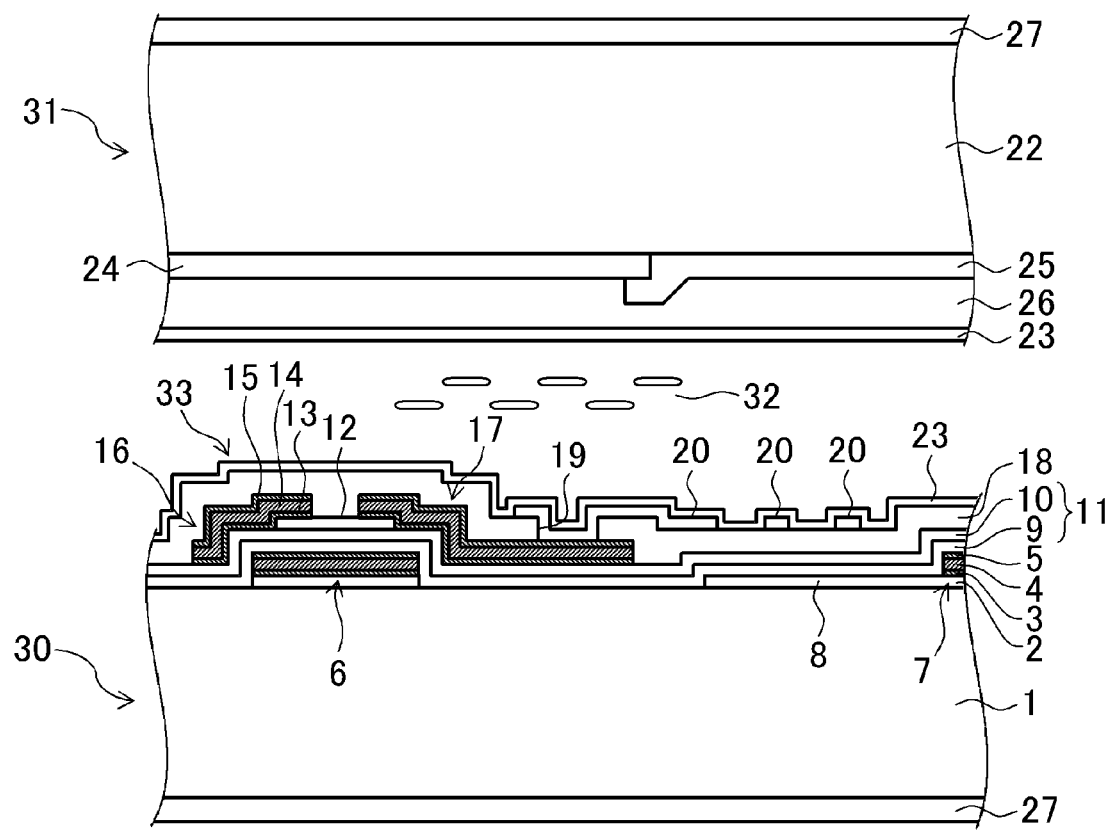
FIG. 5 is a schematic view illustrating a part of a vertical cross section of a liquid crystal display panel of an IPS mode.

FIG. 5 is an enlarged schematic view illustrating a part of a vertical cross section of a liquid crystal display panel of an in-plane switching (IPS) mode. The liquid crystal display panel adopts an active matrix mode, and includes an active matrix substrate 30 and a color filter substrate 31. Liquid crystal 32 is filled in a space between the substrates 30 and 31 disposed with facing each other.

On the surface of the active matrix substrate 30 facing the liquid crystal 32, an active element is formed in accordance with each pixel, and further, an alignment film 23 is formed so as to face the liquid crystal 32. In this embodiment, a CHE-type oxide semiconductor TFT 33 is formed as the active element. The active matrix substrate 30 includes the TFT 33, a common electrode 8, a pixel electrode 20, wiring to those components, and the like formed on the surface of a transparent substrate 1 on the liquid crystal 32 side. The TFT 33 includes a gate electrode 6, a drain electrode 16, a source electrode 17, a channel layer 12, and the like. The TFT 33 illustrated in FIG. 5 is of an inverted staggered type. The channel layer 12 is laminated above the gate electrode 6 with a gate insulating film 11 interposed therebetween, and the drain electrode 16 and the source electrode 17 are formed thereon by using a laminated metal film. The pixel electrode 20 is connected to the source electrode 17 through a through-hole 19 formed in a protective insulating film 18. On the other hand, the drain electrode 16 is connected to a video signal line. When the TFT 33 is turned on in accordance with a voltage applied to the gate electrode 6 from a scanning signal line, a voltage in accordance with a video signal is applied from the video signal line to the pixel electrode 20. In addition, the common electrode 8 formed of a transparent electrode material is disposed so as to correspond to a pixel region, and a predetermined common potential (reference potential) is applied to the common electrode 8 through a common signal line 7. The pixel electrode 20 and the common electrode 8 can generate in the liquid crystal 32 an electric field having a lateral-direction component by virtue of a difference in the potential therebetween, and thus can change the alignment direction of the liquid crystal 32 to drive the liquid crystal 32.

The color filter substrate 31 includes, on the surface of a transparent substrate 22 on the liquid crystal 32 side, a black matrix 24 formed along a boundary between the pixels and a color filter 25 formed in a region corresponding to the pixel. An overcoat layer 26 is formed so as to cover the black matrix 24 and the color filter 25. Further, an alignment film 23 is formed so as to face the liquid crystal 32.

On each of the outer surfaces of the transparent substrates 1 and 22, which construct the active matrix substrate 30 and the color filter substrate 31, respectively, a polarizing film 27 is attached.

A method of manufacturing the CHE-type TFT according to the present invention is hereinafter described with describing a method of manufacturing the active matrix substrate with reference to FIGS. 6A to 10B in this order. FIGS. 6A, 7A, 8A, 9A, and 10A are each an enlarged schematic view illustrating a part of the vertical cross section of the active matrix substrate, in which the TFT is to be formed. Those figures illustrate in order a manufacturing process of the active matrix substrate divided into a plurality of steps. Specifically, the figures each illustrate a state after formation of a photoresist pattern, in which an etching processing of a thin film has been completed and the photoresist is removed. Note that, the illustrated cross sections correspond to the portion illustrated in FIG. 5. In addition, FIGS. 6B, 7B, 8B, 9B, and 10B are schematic process flow diagrams corresponding to FIGS. 6A, 7A, 8A, 9A, and 10A, respectively.

Figure 6A:
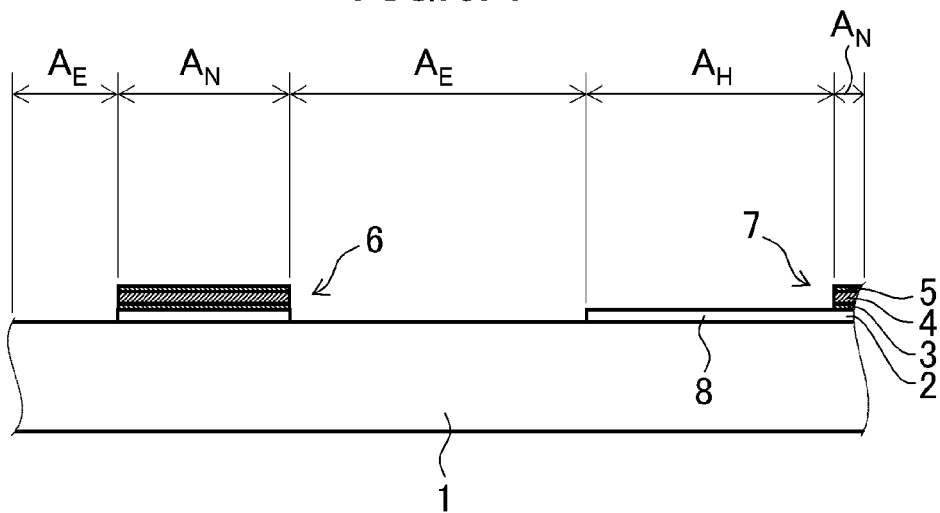
FIG. 6A is a schematic view illustrating a part of a vertical cross section of an active matrix substrate for describing a first photolithography step.
Figure 6B:
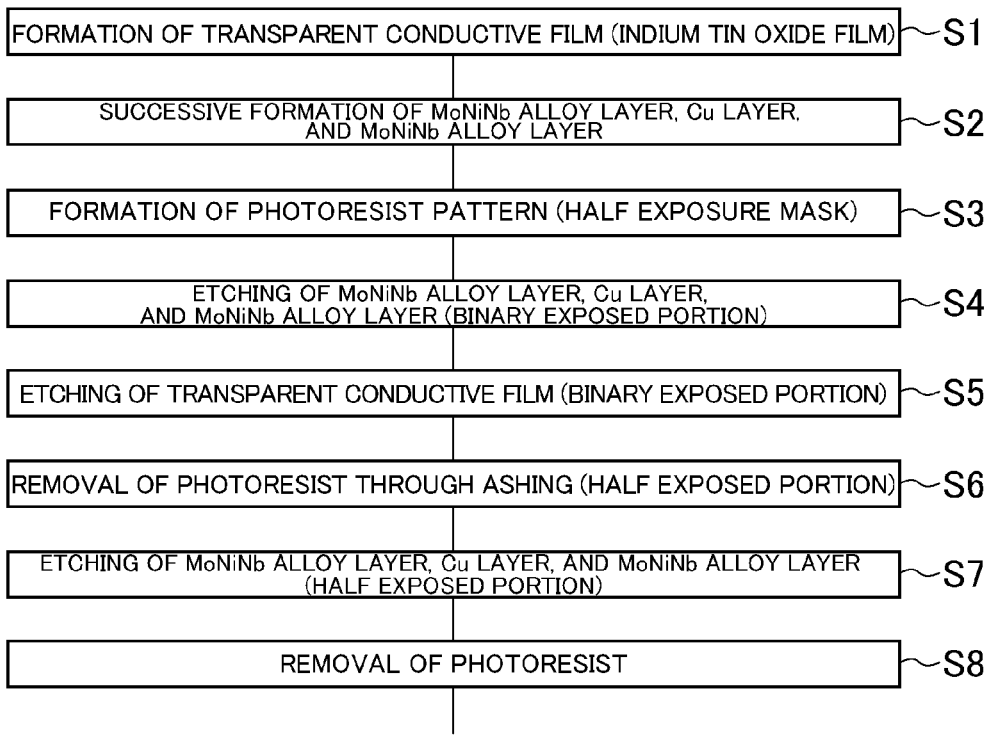
FIG. 6B is a process flow diagram schematically illustrating the first photolithography step.

A first photolithography step is described referring to FIGS. 6A and 6B. First, a transparent conductive film 2 formed of an indium tin oxide (ITO) is formed on the transparent substrate 1 formed of an insulator such as alkali-free glass or the like through sputtering (Step S1). In this case, the transparent conductive film 2 may be formed of an indium zinc oxide (IZO), an indium tin zinc oxide (ITZO), or the like. The thickness of the transparent conductive film 2 is preferably about from 10 nm to 150 nm, and is preferably about 30 nm.

Subsequently, a base layer 3, a low-resistance layer 4, and a cap layer 5 are successively formed in this order through sputtering, to form a laminated metal film (Step S2).

The base layer 3 compensates for the adhesiveness of the low-resistance layer 4 and is formed of, for example, pure molybdenum (Mo) having a purity of 99% or more, an alloy mainly containing Mo, a CuMn alloy, a CuTi alloy, or the like. In some cases, the base layer 3 may be omitted. In this embodiment, the base layer 3 is formed of an alloy containing Mo, nickel (Ni), and niobium (Nb) with the same composition as that of the cap layer 5 described later. The thickness of the base layer 3 is about from 10 nm to 100 nm. In this embodiment, the thickness is 20 nm.

The low-resistance layer 4 is formed of a metal having a low resistivity, such as copper or a copper alloy. In this embodiment, the low-resistance layer 4 is formed of pure Cu having a purity of 99.99% (purity of 4N). The thickness of the low-resistance layer 4 is about from 100 nm to 500 nm, and is determined depending on wiring sheet resistance required in a design.

The cap layer 5 is formed of an alloy mainly containing Mo. It is desired that the alloy mainly containing Mo be a MoNiNb alloy having a Ni content of from 10 to 40 atomic % and a Nb content of from 4 to 20 atomic %, with the balance being Mo. A compositional range of from 15 to 20 atomic % of Ni and from 5 to 10 atomic % of Nb is more preferred. The effect obtained by adopting a MoNiNb alloy having such composition as the cap layer 5 is described later. In this embodiment, the cap layer 5 adopts a MoNiNb alloy having a Ni content of 15 atomic % and a Nb content of 5 atomic %, with the balance being Mo. The thickness of the cap layer 5 is preferably about from 30 nm to 150 nm. In this embodiment, the thickness is 50 nm.

Next, a photoresist pattern is formed by the use of a half exposure mask (Step S3). The photoresist is of a positive type, and the photoresist in an exposed area $A_E$ (binary exposed portion) is removed through development. The photoresist in a half exposed area $A_H$ (half exposed portion) remains with having a smaller thickness than that in a non-exposed area $A_N$. Specifically, portions in which the gate electrode 6, the scanning signal line (not shown), a scanning signal line terminal (not shown), the common signal line 7, and a common signal line terminal (not shown) are to be formed are each formed as the non-exposed area $A_N$ with a photoresist having a lager thickness. A portion in which the common electrode 8 is to be formed is formed as the half exposed area $A_H$ with a photoresist having a smaller thickness.

By using as a mask a photoresist pattern having an opening at a portion corresponding to the exposed area $A_E$, the base layer 3, the low-resistance layer 4, and the cap layer 5 are subjected to one-time etching (Step S4), and then, the transparent conductive film 2 is wet etched (Step S5). The one-time etching solution for the base layer 3, the low-resistance layer 4, and the cap layer 5 is preferably a weak acid aqueous solution containing a component making Cu a complex ion and facilitating dissolution, that is, hydrogen peroxide and an organic acid. When the base layer 3 and the cap layer 5 are each formed of the MoNiNb alloy, the mixed ratio in the alloy is set so that a preferred pattern recession amount is obtained through the etching, and hence a forward tapered cross section having a preferred angle can be obtained with a good yield, as is described later. Specifically, it is possible to prevent the cap layer 5 from receding in the lateral direction abnormally rapidly as compared to the low-resistance layer 4. As a result, the sidewall of the low-resistance layer 4 can be prevented from having a small taper angle, that is, having a gentle slope in the lateral direction. In contrast, it is also possible to prevent the cap layer 5 from being formed into an eaves shape, which occurs when the recession of the cap layer 5 in the lateral direction is smaller than that of the low-resistance layer 4. The etching solution for the transparent conductive film 2 is preferably an aqueous solution of oxalic acid.

Next, the photoresist in the half exposed area $A_H$ is removed through asking (Step S6), to thereby expand the opening of the photoresist pattern to the half exposed area $A_H$. By using the photoresist pattern as a mask, the base layer 3, the low-resistance layer 4, and the cap layer 5 in the half exposed area $A_H$ are removed through etching using a weak acid aqueous solution containing hydrogen peroxide and an organic acid (Step S7). After that, the remaining photoresist is removed with a remover (Step S8).

Through the foregoing steps, the gate electrode 6, the scanning signal line (not shown), the scanning signal line terminal (not shown), the common signal line 7, the common signal line terminal (not shown), the common electrode 8, and the like are formed.

Figure 7A:
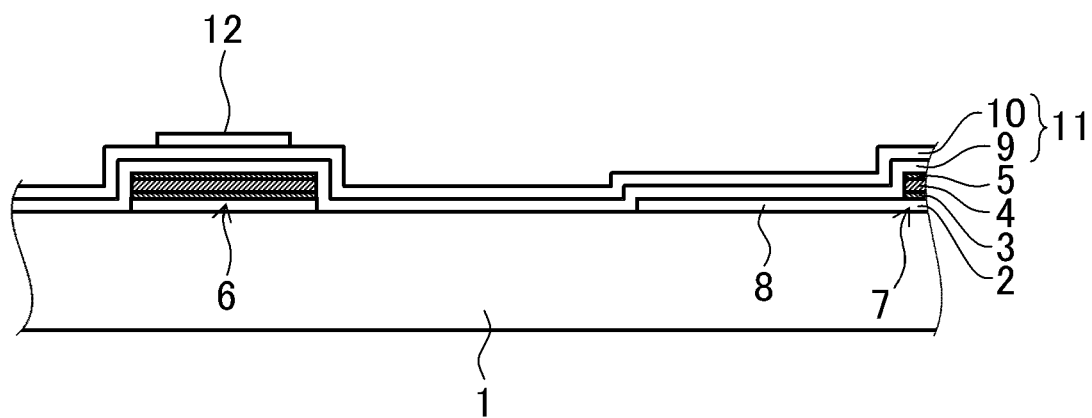
FIG. 7A is a schematic view illustrating a part of a vertical cross section of an active matrix substrate for describing a second photolithography step.
Figure 7B:
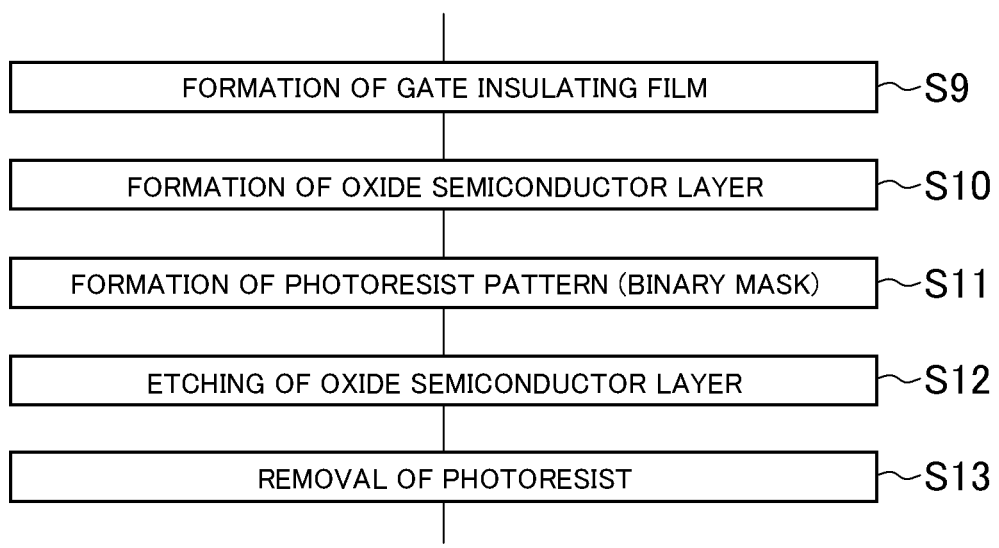
FIG. 7B is a process flow diagram schematically illustrating the second photolithography step.

A second photolithography step subsequent to the first photolithography step is described referring to FIGS. 7A and 7B. A lower gate insulating film 9 is formed through deposition of silicon nitride using $NH_3$ and $SiH_4$ as a raw material gas, and then, an upper gate insulating film 10 is formed through deposition of silicon oxide using $N_2O$ and $SiH_4$ as a raw material gas, by a plasma CVD method. Thus, the gate insulating film 11, which is a laminated film formed of the lower film 9 and the upper film 10, is formed (Step S9).

Note that, when the gate insulating film 11 is formed of a single silicon oxide layer, the gate electrode 6, the scanning signal line (not shown), the scanning signal line terminal (not shown), the common signal line 7, and the common signal line terminal (not shown) are exposed to oxidative plasma derived from $N_2O$ during formation of the silicon oxide layer through deposition. In this regard, in this embodiment, the oxidation of the low-resistance layer 4 can be prevented by virtue of barrier action of the cap layer 5. Therefore, the gate insulating film 11 may be formed of a single silicon oxide layer. In particular, the MoNiNb alloy has higher barrier performance than that of pure Mo, and hence, can achieve a high yield with a relatively small thickness.

Subsequently, an oxide semiconductor layer to form the channel layer 12 is formed through sputtering (Step S10). The oxide semiconductor layer is formed of an oxide including at least one kind of metal element selected from the group of: indium (In); gallium (Ga); zinc (Zn); and tin (Sn). For example, the oxide semiconductor layer may be formed of a mixed oxide of In, Ga, and Zn or a mixed oxide of Zn and Sn. In this embodiment, the oxide semiconductor layer is formed of an amorphous InGaZn mixed oxide having a cation fraction of 1:1:1. The thickness of the oxide semiconductor layer can be set to about from 30 nm to 150 nm. In this embodiment, the thickness is 50 nm.

Next, a photoresist pattern is formed by the use of a binary exposure mask (Step S11). By using the photoresist pattern as a mask, the oxide semiconductor layer is selectively etched to form the channel layer 12 formed of the oxide semiconductor layer having a so-called island-shaped pattern on the surface of the gate insulating film 11 above the gate electrode 6 (Step S12). The etching solution for the oxide semiconductor layer is preferably an aqueous solution of oxalic acid. At the end, the photoresist is removed with a remover (Step S13).

Through the forgoing steps, the gate insulating film 11 and the channel layer 12 are formed.

Figure 8A:
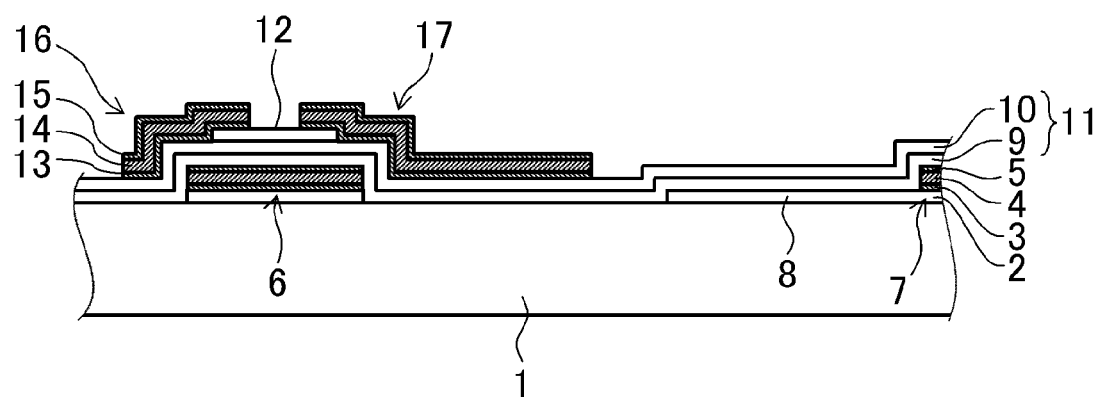
FIG. 8A is a schematic view illustrating a part of a vertical cross section of an active matrix substrate for describing a third photolithography step.
Figure 8B:
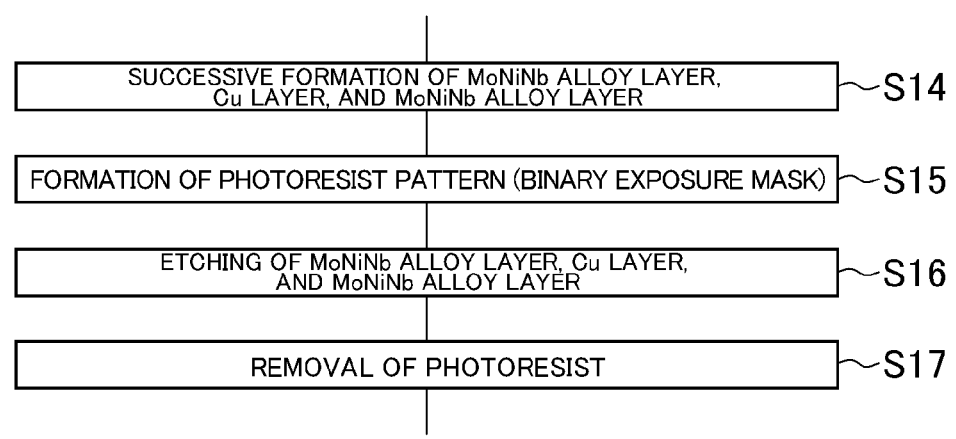
FIG. 8B is a process flow diagram schematically illustrating the third photolithography step.

A third photolithography step subsequent to the second photolithography step is described referring to FIGS. 8A and 8B. On the surfaces of the gate insulating film. 11 and the channel layer 12, a base layer 13, a low-resistance layer 14, and a cap layer 15 are successively formed in this order through sputtering, to form a laminated metal film (Step S14). With the laminated metal film, the drain electrode 16, the source electrode 17, and the like are formed.

The base layer 13 is formed for securing ohmic contact between the drain electrode 16 or the source electrode 17 and the channel layer 12, compensating for the adhesiveness of the low-resistance layer 14, and preventing diffusion of Cu into the oxide semiconductor layer. For example, the base layer 13 is formed of pure Mo having a purity of 99% or more, an alloy mainly containing Mo, or the like. In this embodiment, the base layer 13 is formed of a MoNiNb alloy having the same composition as that of the cap layer 15 described later. The thickness of the base layer 13 is about from 10 nm to 100 nm. In this embodiment, the thickness is 20 nm.

The low-resistance layer 14 is formed of a metal having a low resistivity, such as Cu or a Cu alloy. In this embodiment, the low-resistance layer 14 is formed of pure Cu having a purity of 4N. The thickness of the low-resistance layer 14 is about from 100 nm to 500 nm, and is determined depending on wiring sheet resistance required in a design.

The cap layer 15 is formed of an alloy mainly containing Mo. It is desired that the alloy mainly containing Mo be a MoNiNb alloy having a Ni content of from 10 to 40 atomic % and a Nb content of from 4 to 20 atomic %, with the balance being Mo. A compositional range of from 15 to 20 atomic % of Ni and from 5 to 10 atomic % of Nb is more preferred. The effect obtained by adopting a MoNiNb alloy having such composition as the cap layer 15 is described later. In this embodiment, the cap layer 15 adopts a MoNiNb alloy having a Ni content of 15 atomic % and a Nb content of 5 atomic %, with the balance being Mo. The thickness of the cap layer 15 is preferably about from 30 nm to 150 nm. In this embodiment, the thickness is 50 nm.

Next, a photoresist pattern is formed by the use of a binary exposure mask (Step S15), and then, the base layer 13, the low-resistance layer 14, and the cap layer 15 are subjected to one-time etching (Step S16). The etching solution for the base layer 13, the low-resistance layer 14, and the cap layer 15 is preferably a weak acid aqueous solution containing hydrogen peroxide and an organic acid. This enables etching without dissolving the oxide semiconductor layer and causing in the oxide semiconductor layer such a damage as to increase the carrier density in its surface. When the base layer 13 and the cap layer 15 are each formed of a MoNiNb alloy, a forward tapered cross section having a preferred angle can be obtained in the etching with a good yield, as in the case of the above-mentioned laminated metal film for forming the gate electrode 6, and the like. At the end, the photoresist is removed with a remover (Step S17).

Through the foregoing steps, the drain electrode 16, the source electrode 17, the video signal line (not shown), a video signal line terminal (not shown), and the like are formed.

Figure 9A:
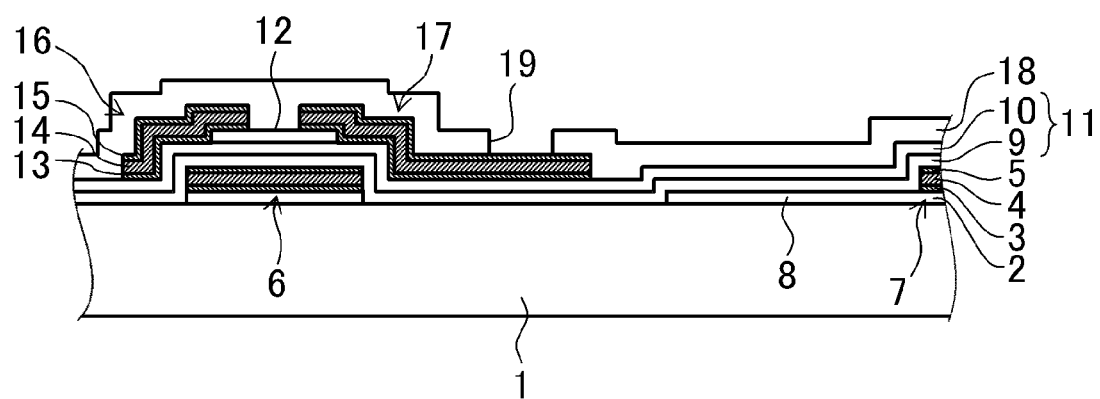
FIG. 9A is a schematic view illustrating a part of a vertical cross section of an active matrix substrate for describing a fourth photolithography step.
Figure 9B:
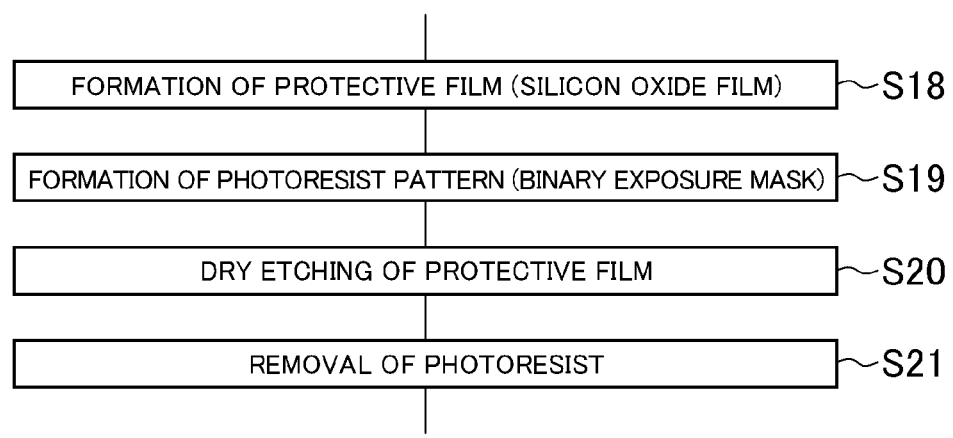
FIG. 9B is a process flow diagram schematically illustrating the fourth photolithography step.

A fourth photolithography step subsequent to the third photolithography step is described referring to FIGS. 9A and 9B. First, a protective insulating film 18 (protective film) formed of silicon oxide is formed by a plasma CVD method using $N_2O$ and $SiH_4$ as raw material gas (Step S18). In this process, the drain electrode 16, the source electrode 17, and the like formed of the laminated metal film in the above-mentioned third photolithography step are exposed to oxidative plasma derived from $N_2O$. The cap layer 15 is formed of an oxidation-resistant material having a barrier function against the oxidizing atmosphere, and hence, prevents oxidation of the low-resistance layer 14. In particular, the MoNiNb alloy adopted in this embodiment has higher barrier performance than that of pure Mo, and hence, can achieve a high yield with a relatively small thickness.

Next, a photoresist pattern is formed by the use of a binary exposure mask (Step S19). Dry etching is performed by using the photoresist pattern as an etching mask and fluorine-based gas such as $SF_6$, $CF_4$, or the like, to form the through-hole 19 in the protective insulating film 18 on the source electrode 17, the video signal line terminal (not shown), and the like, and at the same time, form a through-hole (not shown) in the protective insulating film 18 and the gate insulating film 11 on the scanning signal line terminal (not shown) (Step S20). In this process, the cap layers 15, 5 of the source electrode 17, the video signal line terminal (not shown), the scanning signal line terminal (not shown), and the like exposed at the bottom of the through-holes are exposed to the dry etching gas. In particular, the cap layer 15 of the source electrode 17 and the video signal line terminal (not shown) are exposed for a longer time period. A material having corrosion resistance to the dry etching is used as a material for the cap layers 15, 5. This prevents the low-resistance layers 14, 4 serving as their lower layer from being exposed to the dry etching gas and damaged. In addition, with regard to contact between a transparent conductive film to be subsequently formed and the source electrode 17 and the like through the through-hole, good electric characteristics can be obtained. In this regard, the MoNiNb alloy to be used in this embodiment is preferred because of having corrosion resistance to the dry etching treatment using a fluorine-based gas, unlike pure Mo. At the end, the photoresist is removed through asking in combination with the use of a remover (Step S21).

Through the foregoing steps, the protective insulating film 18 and the through-hole 19 are formed.

Figure 10A:
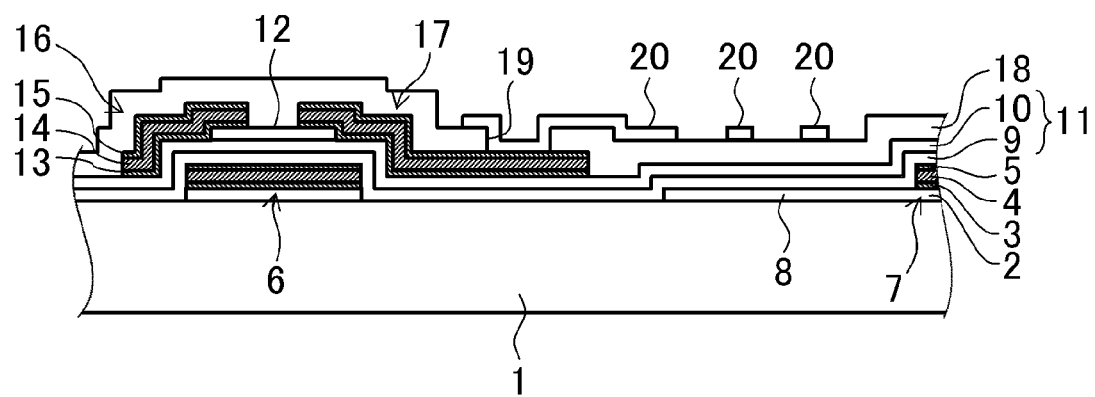
FIG. 10A is a schematic view illustrating a part of a vertical cross section of an active matrix substrate for describing a fifth photolithography step.
Figure 10B:
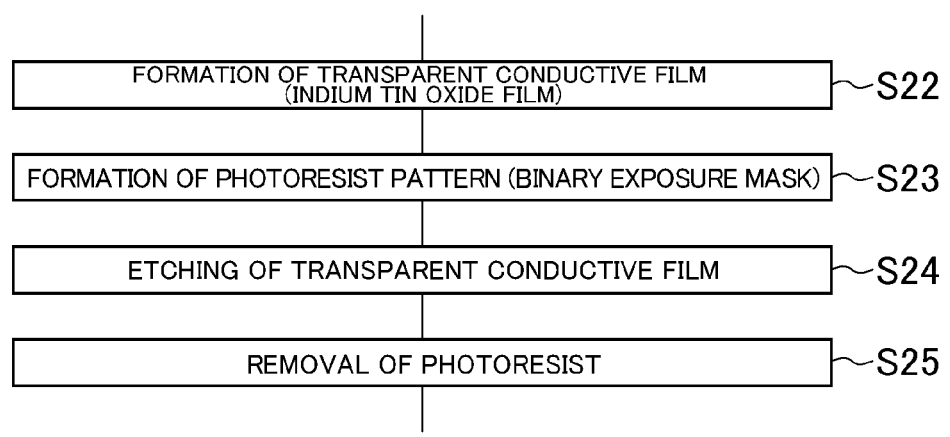
FIG. 10B is a process flow diagram schematically illustrating the fifth photolithography step.

A fifth photolithography step subsequent to the fourth photolithography step is described referring to FIGS. 10A and 10B. A transparent conductive film formed of an ITO is formed through sputtering (Step S22). The transparent conductive film may be formed of an IZO, an ITZO, or the like. The transparent conductive film is formed to have thickness about from 10 nm to 150 nm, and the thickness is preferably about 50 nm.

Next, a photoresist pattern is formed by the use of a binary exposure mask (Step S23). By using the photoresist pattern as an etching mask, the transparent conductive film is subjected to etching processing (Step S24). The etching solution for the transparent conductive film is preferably an aqueous solution of oxalic acid. At the end, the photoresist is removed with a remover (Step S25).

Through the foregoing steps, the pixel electrode 20 that is electrically connected to the source electrode 17 through the through-hole 19, the scanning signal line terminal (not shown), the common signal line terminal (not shown), the video signal line terminal (not shown), and the like, are formed.

Through the above-mentioned first to fifth photolithography steps, the active matrix substrate of the liquid crystal display panel illustrated in FIG. 5 is completed.

The TAOS-TFT described above was of an inverted staggered CHE-type. In addition to this type of TFT, a coplanar-type TFT or a CES-type TFT can be realized through combination of the wiring material and etching solution of the present invention. Further, also an a-Si-TFT can be realized through combination of the wiring material and etching solution of the present invention. Those TFTs are manufactured easily from a viewpoint of their processes as compared to the manufacturing of the CHE-type TAOS-TFT.

[Experimental Result]

In this embodiment, it is preferred that the cap layers 5, 15 be formed of a MoNiNb alloy. It is particularly preferred that the MoNiNb alloy have such a mixed ratio that the content of nickel is from 10 to 40 atomic % and the content of niobium is from 4 to 20 atomic %, with the balance being molybdenum. Experimental results in this regard are hereinafter described. FIG. 11 is a table summarizing experimental results. 13 Kinds of samples having different compositions were each evaluated for oxidation resistance, processability in wet etching, and dry etching (D/E) resistance.

(Sample)

The samples were each obtained by forming a thin film having a laminated structure of cap layer/low-resistance layer/base layer on a glass substrate by a sputtering method. The cap layers had kinds of compositions shown in FIG. 11. For example, the "Mo-10Ni-4Nb" of sample No. 4 represents that the content of Ni is 10 atomic % (at %) and the content of Nb is 4 at %, with the balance being Mo. The low-resistance layer was formed of pure Cu having a purity of 4N. The base layer had the same composition as that of the cap layer. The thicknesses of the cap layer, low-resistance layer, and base layer were 50 nm, 300 nm, and 20 nm, respectively.

(Evaluation of Oxidation Resistance)

The step of forming a silicon oxide layer by CVD (Step S18) was simulated. The thin film samples were each exposed to $N_2O$ plasma (substrate temperature: 270° C.), and evaluated for the oxidation resistance through measurement of sheet resistance by a four probe method and observation of surface spot occurrence with an optical microscope.

Those thin film samples are each expected to have a sheet resistance of about 0.067 ohms per square (ohms/sq.) based on the resistivity of the thin Cu film (about 20 n[ohm]m) serving as the low-resistance layer and its thickness (300 nm). However, the thin film samples having a cap layer composition of pure Mo (sample No. 1) and Mo-4 at % Nb (sample No. 2), not containing Ni, each had a sheet resistance that was roughly one digit higher than the expected value owing to oxidation of the low-resistance layer. In addition, many spots derived from copper oxide were observed on the surfaces of those samples. In the case of Mo-10 at % Ni (sample No. 3), the sheet resistance did not significantly increase, but a few spots derived from copper oxide were observed on the surface of the sample. For example, when the spot portion forms a signal line, a defect such as disconnection occurs. For the cap layer compositions of the sample Nos. 1 to 3, the oxidation resistance was judged as No-Good. On the other hand, in the cases of MoNiNb ternary alloys (sample Nos. 4 to 13), the sheet resistance was roughly the expected value and no spots were observed. Therefore, the oxidation resistance in those cases was judged as Good.

(Evaluation of Processability)

The one-time wet etching of the laminated metal film formed of the thin film having a structure of cap layer/low-resistance layer/base layer (performed in Steps S4, S7, and S16) was simulated. The thin film samples having a photoresist pattern formed thereon were each etched with an aqueous solution having a pH of 3 and containing hydrogen peroxide and an organic acid. Then, the cross section of an edge of a thin film pattern after the etching was observed with a scanning electron microscope. The processability was evaluated by reading the recession amount of the edge of the base layer with respect to the edge of the photoresist pattern and the sidewall taper angle of the low-resistance layer. Note that, the etching time period was set to a time period that was 1.5 times longer than a just etching time period.

It is desired that the recession amount of the base layer be roughly less than 1 μm. However, in the cases of Mo-10 at % Ni (sample No. 3) having a MoNi binary cap layer composition and Mo-50 at % Ni-4 at % Nb (sample No. 13) falling within a MoNiNb ternary alloy but having an especially high Ni content, the recession amount of the base layer is significantly large. Therefore, the processability was judged as No-Good in those cases.

In addition, the taper angle is desirably 20 degrees or more and less than 70 degrees, particularly preferably 30 degrees or more and less than 50 degrees. However, in the cases of cap layer compositions of pure Mo (sample No. 1) and Mo-4 at % Nb (sample No. 2), not containing Ni, the taper angle is less than 10 degrees. That is, the cap layer is in a state of being largely recessed, and hence, cannot exhibit the expected oxidation resistance. Therefore, the processability was judged as No-Good in those cases. In addition, in the case of Mo-10 at % Ni-30 at % Nb (sample No. 6) having an especially high Nb content, the taper angle is 87 degrees, which means that the sidewall is almost perpendicular to the substrate surface. This impairs coatability of the gate insulating film or protective insulating film for covering the cap layer. Therefore, the processability was judged as No-Good in this case. In contrast, in the cases of other cap layer compositions (sample Nos. 4, 5, and 7 to 12), both the recession amount of the base layer and the taper angle fall within desired ranges. Therefore, the processability was judged as Good in those cases. Of those cases, the cases of cap layer compositions (sample Nos. 7 to 10) falling within a range of from 15 to 20 at % of Ni and from 5 to 10 at % of Nb, the taper angle falls within a particularly preferred range. Therefore, the processability was judged as Particularly-Good in those cases.

(Evaluation of Dry Etching Resistance)

The step of dry etching the protective insulating film 18 to form the through-hole 19 and the like (Step S20) was simulated. The thin film samples having a photoresist pattern formed thereon were each dry etched using $SF_6$ gas. Then, the etching rate was calculated based on an etching depth and an etching time period. Further, the selectivity ratio was calculated from a ratio between the calculated etching rate and an etching rate of silicon oxide. Thus, the corrosion resistance to dry etching was evaluated.

It is desired that the selectivity ratio be roughly 6 or more. However, in the cases of the thin film samples having cap layer compositions of pure Mo (sample No. 1) and Mo-4 at % Nb (sample No. 2), not containing Ni, the selectivity ratio is as low as 4 or less. Therefore, the dry etching resistance was judged as No-Good in those cases. In contrast, in the cases of other thin film samples having cap layer compositions containing 10 at % or more of Ni (sample Nos. 3 to 13), the selectivity ratio is as high as 8 or more. Therefore, the dry etching resistance was judged as Good in those cases.

(Total Evaluation)

Based on the foregoing evaluation results of the oxidation resistance, processability, and dry etching resistance, the cap film (cap layer) compositions of the thin film samples were totally evaluated. The case where any one of the oxidation resistance, processability, and dry etching resistance was judged as No-Good was judged as No-Good in total evaluation. In addition, the case where all the oxidation resistance, processability, and dry etching resistance were judged as Good was judged as Good in total evaluation. Of those cases, the case where the processability was judged as Particularly-Good was judged as Particularly-Good in total evaluation.

As the cap film (cap layer), the MoNiNb ternary alloys having a compositional range of from 10 to 40 at % of Ni and from 4 to 20 at % of Nb (sample Nos. 4, 5, and 7 to 12) were judged as Good. Of those alloys, the MoNiNb ternary alloys having a compositional range of from 15 to 20 at % of Ni and from 5 to 10 at % of Nb (sample Nos. 7 to 10) were judged as Particularly-Good.

Next, the characteristics of a channel etch type TAOS-TFT manufactured by the above-mentioned method are described with reference to the drawings.

Figure 12:
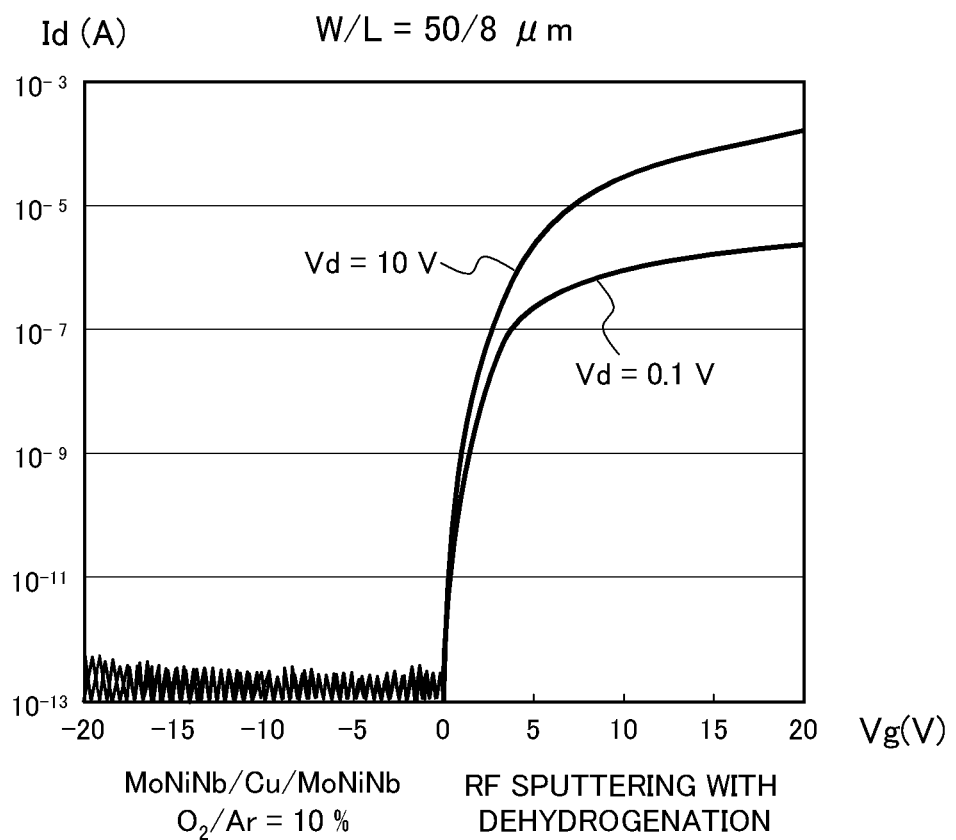
FIG. 12 shows Vg-Id characteristics of a CHE-type TAOS-TFT in the case of adopting a Mo alloy/Cu/Mo alloy three-layer structure as SD wiring.
Figure 13:
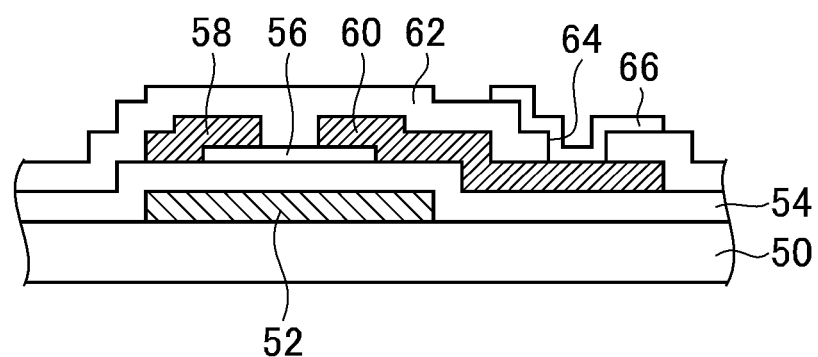
FIG. 13 is a schematic vertical sectional view of a CHE-type TFT.
Figure 14:
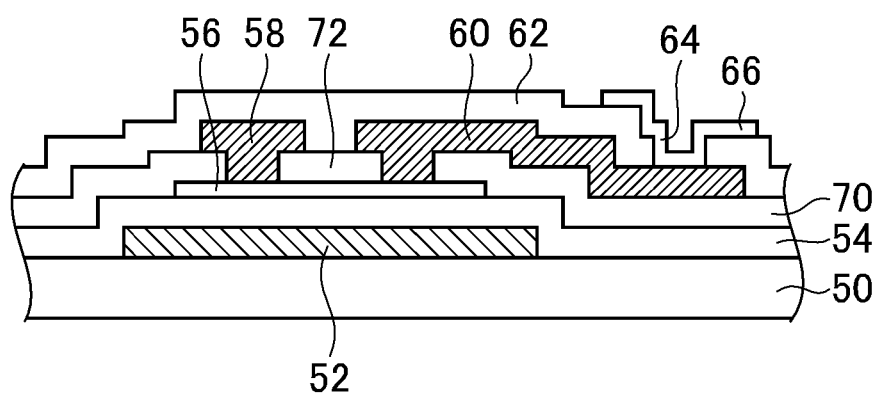
FIG. 14 is a schematic vertical sectional view of a CES-type TFT.

FIG. 12 shows Vg-Id characteristics of a channel etch type TFT formed by the manufacturing method according to the present invention. In FIG. 12, the horizontal axis represents a gate voltage Vg and the vertical axis represents a drain current Id. The SD wiring material has a Mo alloy/Cu/Mo alloy three-layer structure with a Mo alloy composition of Mo-20 at % Ni-5 at % Nb. The thicknesses of the upper Mo alloy layer, Cu layer, and lower Mo alloy layer are 50 nm, 300 nm, and 20 nm, respectively. The TFT has a channel width W of 50 µm and a channel length L of 8 µm.

The Vg-Id characteristics are shown for the cases of a voltage Vd between SD electrodes of 10 V and 0.1 V. For each of the characteristic values, the mobility µ is 7.0 $cm^2$/Vs, the threshold voltage Vth is 2.0 V, and the S value S is 0.7 V/dec. In SD etching, there was no degradation in the TAOS film, and in CVD of a passivation $SiO_2$ film, the SD metal was not oxidized. Thus, good TFT characteristics were obtained.

Next, the result of evaluating reliability of the TFT, the Vg-Id characteristics of which are shown in FIG. 12, is described. ΔVth, which was a shift in Vth immediately after loading a stress under the conditions of Vg=±20 V, Vd=0 V, 90° C., and 2,000 seconds, was +0.6 V and −0.8 V for positive bias (+20 V) and negative bias (−20 V), respectively. The ΔVths were each a value of less than 1 V.

As described in the embodiments, a channel etch type TAOS-TFT having excellent characteristics was able to be manufactured by the method of manufacturing a thin film transistor of the present invention. The manufacturing method of the present invention has the strength of providing an etching method for SD wiring that enables manufacturing of a channel etch type TFT. The etching method can be applied to other device structures such as a channel etch stopper type, a coplanar type, and the like. And rightfully, the present invention can be applied as combination of the wiring material and the etching of an a-Si-TFT.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A method of manufacturing a thin film transistor comprising a gate electrode, a gate insulating film, a channel layer containing an oxide semiconductor, a source electrode, a drain electrode, and a protective film covering the source electrode and the drain electrode, the method comprising:
    forming at least one of the source electrode and the drain electrode by using a laminated metal film comprising a lower barrier layer, a low-resistance main wiring layer, and an upper cap layer arranged in this order when viewed from the channel layer toward the protective film, the low-resistance main wiring layer mainly containing one of copper and an copper alloy, the lower barrier layer mainly containing a molybdenum alloy, and the upper cap layer mainly containing a molybdenum alloy containing nickel and made from a different material from the low-resistance main wiring layer; and
    patterning the lower barrier layer, the low-resistance main wiring layer, and the upper cap layer of the laminated metal film together by wet etching using a solution mainly containing hydrogen peroxide and an organic acid.

2. The method of manufacturing a thin film transistor according to claim 1, wherein the molybdenum alloy of the upper cap layer contains nickel and niobium.

3. The method of manufacturing a thin film transistor according to claim 2, wherein the molybdenum alloy of the upper cap layer contains 10 to 40 atomic % of nickel and 4 to 20 atomic % of niobium, with the balance being molybdenum.

4. The method of manufacturing a thin film transistor according to claim 2, wherein at least one of the source electrode and the drain electrode has a sidewall taper angle of 20 degrees or more and less than 70 degrees.

5. The method of manufacturing the thin film transistor according to claim 2, wherein the molybdenum alloy of the upper cap layer contains 15 to 20 atomic % of nickel and 5 to 10 atomic % of niobium, with the balance being molybdenum.

6. The method of manufacturing a thin film transistor according to claim 1, further comprising:
    forming the gate electrode on an insulating substrate;
    forming the gate insulating film on the gate electrode;
    forming the channel layer mainly containing the oxide semiconductor on the gate insulating film;
    forming the laminated metal film comprising the lower barrier layer containing a molybdenum alloy containing nickel and niobium, the low-resistance main wiring layer containing one of copper and a copper alloy, and the upper cap layer containing a molybdenum alloy containing nickel and niobium so that the laminated metal film covers the channel layer;
    forming the source electrode and the drain electrode so as to be separated from each other with a space therebetween on the channel layer by patterning the lower barrier layer, the low-resistance main wiring layer, and the upper cap layer of the laminated metal film together by wet etching using a solution mainly containing hydrogen peroxide and an organic acid; and
    forming the protective film for covering the source electrode, the drain electrode, and the channel layer in a part exposed in the space while the source electrode and the drain electrode are exposed to oxidative plasma.

7. The method of manufacturing a thin film transistor according to claim 1, further comprising:
    forming the gate electrode on an insulating substrate;
    forming the gate insulating film on the gate electrode;
    forming the channel layer mainly containing the oxide semiconductor on the gate insulating film;
    forming a channel protective layer on a part of the channel layer and a part of the gate insulating film;
    forming the laminated metal film comprising the lower barrier layer containing a molybdenum alloy containing nickel and niobium, the low-resistance main wiring layer containing one of copper and a copper alloy, and the upper cap layer containing a molybdenum alloy containing nickel and niobium so that the laminated metal film covers the channel layer;
    forming the source electrode and the drain electrode so as to be separated from each other with a space therebetween above the gate electrode by patterning the lower barrier layer, the low-resistance main wiring layer, and the upper cap layer of the laminated metal film together by wet etching using a solution mainly containing hydrogen peroxide and an organic acid; and
    forming the protective film for covering the source electrode, the drain electrode, and the channel protective layer while the source electrode and the drain electrode are exposed to oxidative plasma.

8. The method of manufacturing a thin film transistor according to claim 1, further comprising forming a contact hole by dry etching of the protective film,
    wherein the upper cap layer of one of the source electrode and the drain electrode is exposed at a bottom of the contact hole.

9. The method of manufacturing a thin film transistor according to claim 1, wherein the oxide semiconductor comprises an oxide containing at least one kind of metal element selected from the group consisting of: indium; gallium; zinc; and tin.

10. A method of manufacturing a thin film transistor comprising a gate electrode, a gate insulating film, a channel layer containing an oxide semiconductor, a source electrode, a drain electrode, and a protective film covering the source electrode and the drain electrode, the method comprising:
    forming the gate electrode on a substrate by using a laminated metal film comprising a lower barrier layer, a low-resistance main wiring layer, and an upper cap layer arranged in this order when viewed from the substrate toward the channel layer, the low-resistance main wiring layer mainly containing one of copper and an copper alloy, the lower barrier layer mainly containing a molybdenum alloy, and the upper cap layer mainly containing a molybdenum alloy containing nickel and made from a different material from the low-resistance main wiring; and
    patterning the lower barrier layer, the low-resistance main wiring layer, and the upper cap layer of the laminated metal film together by wet etching using a solution mainly containing hydrogen peroxide and an organic acid.

11. The method of manufacturing a thin film transistor according to claim 10, wherein the molybdenum alloy of the upper cap layer contains nickel and niobium.

12. The method of manufacturing a thin film transistor according to claim 11, wherein the molybdenum alloy of the upper cap layer contains 10 to 40 atomic % of nickel and 4 to 20 atomic % of niobium, with the balance being molybdenum.

13. The method of manufacturing the thin film transistor according to claim 11, wherein the molybdenum alloy of the upper cap layer contains 15 to 20 atomic % of nickel and 5 to 10 atomic % of niobium, with the balance being molybdenum.

14. The method of manufacturing a thin film transistor according to claim 10, wherein the oxide semiconductor comprises an oxide containing at least one kind of metal element selected from the group consisting of: indium; gallium; zinc; and tin.

15. The method of manufacturing a thin film transistor according to claim 10, wherein the gate electrode has a sidewall taper angle of 20 degrees or more and less than 70 degrees.

* * * * *